United States Patent [19]

Kang

[11] Patent Number: 5,703,406
[45] Date of Patent: Dec. 30, 1997

US005703406A

[54] INTERCONNECTION STRUCTURE FOR ATTACHING A SEMICONDUCTOR DEVICE TO A SUBSTRATE

[75] Inventor: Dae Soon Kang, Choongchungbook-Do, Rep. of Korea

[73] Assignee: LG Semicon Co., Ltd., Cheongju, Rep. of Korea

[21] Appl. No.: 587,744

[22] Filed: Jan. 19, 1996

[30] Foreign Application Priority Data

Sep. 22, 1995 [KR] Rep. of Korea .............. 31431/1995

[51] Int. Cl.$^6$ ...................................... H01L 23/48
[52] U.S. Cl. .............................. 257/778; 257/780
[58] Field of Search ........................ 257/778, 780, 257/690, 698, 701, 783

[56] References Cited

FOREIGN PATENT DOCUMENTS 4-273464  9/1992  Japan ................... 257/778

OTHER PUBLICATIONS

IBM Technical Disclosure Bulletin, vol. 38 No. 12 Dec. 1995.

*Primary Examiner*—Wael Fahmy
*Assistant Examiner*—Roy Potter
*Attorney, Agent, or Firm*—Fleshner & Kim

[57] ABSTRACT

An interconnection structure for bonding a semiconductor device on a substrate includes a semiconductor chip having a plurality of solder balls attached thereto; and an under-fill substance layer being adjacently bonded to the semiconductor chip and having a plurality of holes therein. By employing the structure, when the semiconductor chip and the substrate are electrically bonded, a previously provided under fill substance layer is used without any additional under filling step, so that the entire process can be simplified and its reliability can be improved.

9 Claims, 3 Drawing Sheets

5,703,406

INTERCONNECTION STRUCTURE FOR ATTACHING A SEMICONDUCTOR DEVICE TO A SUBSTRATE

BACKGROUND OF THE INVENTION

1. Field of the Invention

The present invention relates to an interconnection structure for bonding a semiconductor device to a substrate, and more particularly to an interconnection structure for simultaneously performing under-filling in bonding the semiconductor device to a supporting board or to the substrate.

2. Description of the Prior Art

A conventional interconnection structure for bonding a semiconductor device to a substrate is known as shown in FIGS. 1A and 1B. Reference numeral 1 denotes a semiconductor chip which is provided with a plurality of solder balls 2 at the lower part thereof. The plurality of solder balls may be substituted by solder bumps. An under-fill region 4 is formed at an outer circumferential surface of the solder balls 2 formed between the semiconductor chip 1 and a printed circuit board 3.

In the semiconductor device having such a construction, the semiconductor chip 1 is bonded on the printed circuit board 3 by heating or by pressing. Thereafter, an epoxy molding compound (not shown) is injected to the under-fill region 4 by using a nozzle 7 as shown in FIG. 1B. Then, the epoxy molding compound flows into the under-fill region 4 to perform under filling, thereby completing a flip chip package or a chip scale package.

However, for the purpose of bonding the semiconductor device, since the interconnection structure as constructed above adapts a method of injecting the epoxy molding compound between the semiconductor chip and the printed circuit board, forcibly or by using a force of gravity, the following problems may arise.

First, since any air bubbles included in the substance injected between the semiconductor chip and the printed circuit board are not easily removed, cracks may occur in the under-fill substance and solder balls(bumps).

Secondly, since the substance injected between the semiconductor chip and the printed circuit board does not constantly maintain its bonding force, a reliability of the product is degraded, and a short circuit may occur.

Thirdly, because a step for under filing must be additionally performed, the entire process is complicated, causing an increase in production cost and a decrease in productivity.

SUMMARY OF THE INVENTION

Therefore, an object of the present invention is to provide an improved interconnection structure for reliably bonding a semiconductor device on a substrate which overcomes the above-mentioned problems.

Another object of the present invention is to provide an interconnection structure for bonding a semiconductor device on a substrate capable of increasing an interfacial bonding force between the semiconductor device and a printed circuit board by depositing and pressing an under-fill substance.

In order to attain the above objects, there is provided an interconnection structure including a semiconductor chip having a plurality of solder balls attached thereto; and an under-fill substance layer having a plurality of holes therein.

BRIEF DESCRIPTION OF THE DRAWINGS

FIG. 2B is a perspective view of an under-fill substance layer in accordance with the present invention;

DETAILED DESCRIPTION OF THE INVENTION

A preferred embodiment of the present invention will now be described with reference to the accompanying drawings.

Figure 1A:
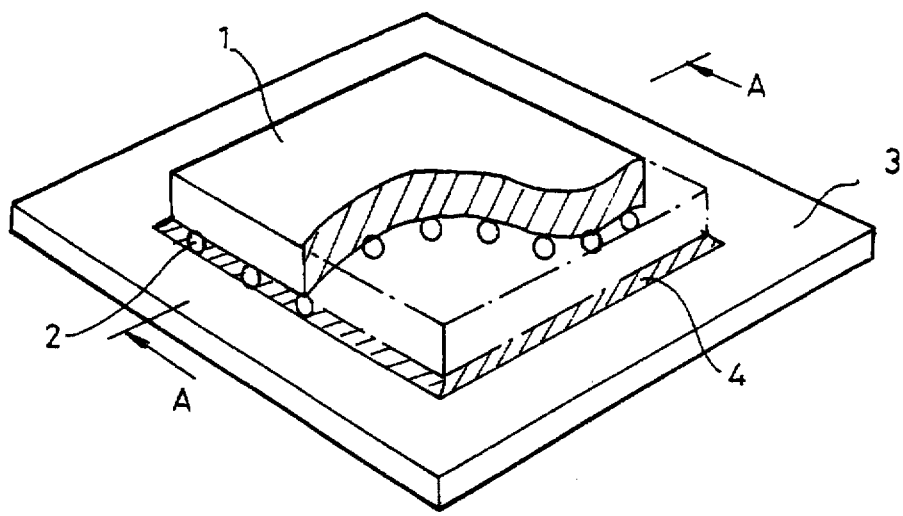
FIG. 1A is a schematic perspective view of a conventional flip chip package.
Figure 1B:
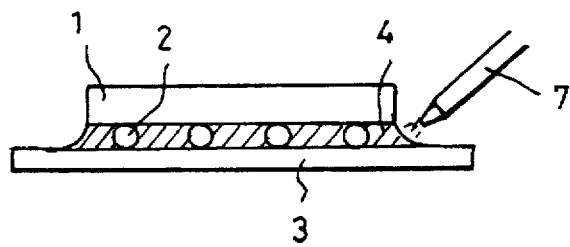
Figure 2A:
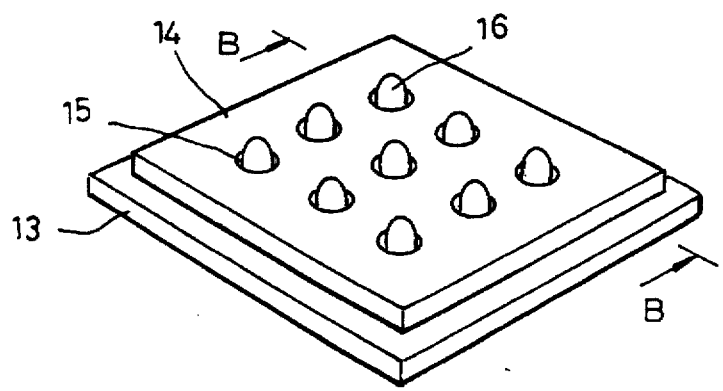
FIG. 2A is a perspective view of an interconnection structure in accordance with one embodiment of the present invention.

FIG. 2A is a perspective view of an interconnection structure in accordance with an embodiment of the present invention. As shown in this figure, a planarized under-fill substance layer 14 is attached on a semiconductor chip 18 having a plurality of solder balls 16 (referring to FIG. 2C).

Figure 2B:
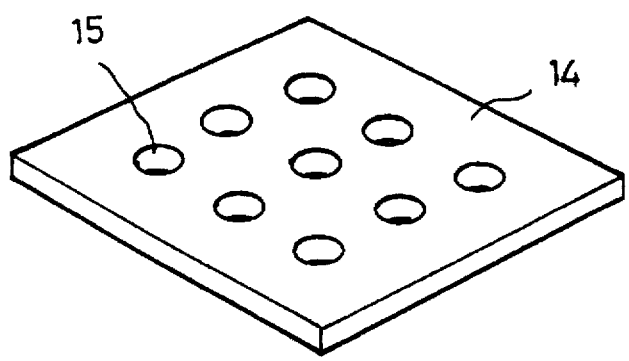
FIG. 2B is a cross-sectional view taken along line A—A of FIG. 1A.

Referring to FIG. 2B, the under-fill substance layer 14 has a square form, in which a plurality of holes 15 are formed at regular intervals in a matrix arrangement. The form and structure of the holes 15 can be varied depending on the form and the structure of the solder balls 16 (to be described later), and for which an oval type is preferable as shown in FIG. 2B.

Figure 2C:
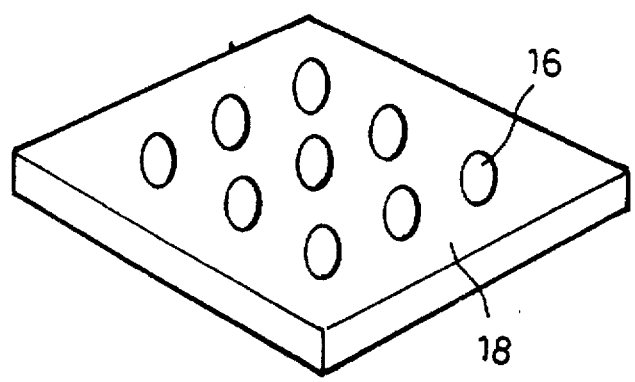
FIG. 2C is a perspective view of a semiconductor chip adapted in accordance with the present invention.

FIG. 2C is a perspective view of the semiconductor chip. The semiconductor chip 18 adapted to the present invention is provided with the plurality of solder balls 16 likewise as in a BGA (Ball Grid Array) package. The plurality of solder balls 16 and the holes 15 are formed to be correspondingly inserted accommodated with each other. Thus, on an upper surface of the printed circuit board 13, an under-fill substance layer 14 is formed and then the semiconductor chip 18 is mounted.

Figure 3:
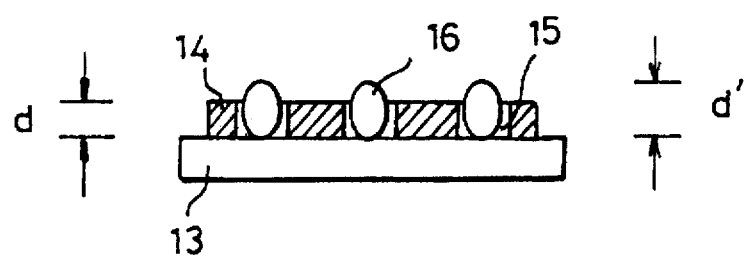
FIG. 3 is a cross-sectional view taken along line B—B of FIG. 2A.

FIG. 3 is a cross-sectional view taken along line B—B of FIG. 2A. As shown in FIG. 3, the under-fill substance layer 14 is so tightly joined to the semiconductor chip 18 (referring to FIGS. 4A and 4B) as to be formed in one body therewith. In this respect, it is preferable that the height "d" of the under-fill substance layer 14 is lower than the height "d'" of the solder ball 16.

Figure 4A:
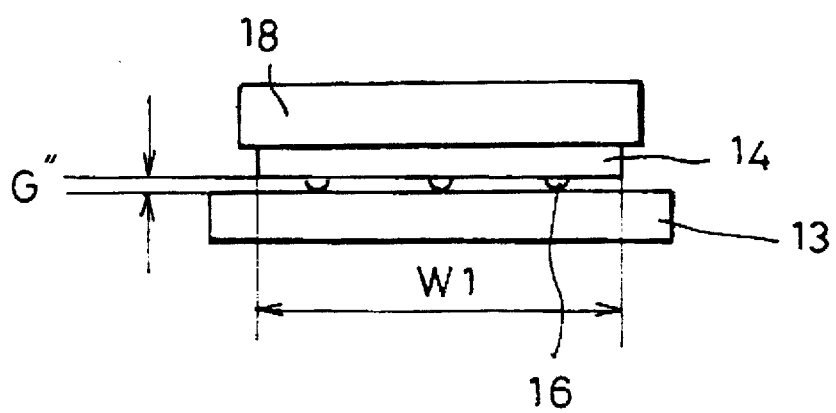
FIG. 4A is a cross-sectional view showing a pressing step of the under-fill substance layer.

FIG. 4A is a cross-sectional view showing a pressing step of the under-fill substance layer. As shown in this figure, the semiconductor chip 18 having the solder balls 16 is positioned on the printed circuit board 13, and thereafter, a bonding step is performed by applying heating and pressure. At this time, the solder balls 16 are first compressed by as much as a predetermined distance "G", and subsequently the under-fill substance layer 14 is compressed by a compressing means (not shown). In this respect, when the under-fill substance layer 14 is compressed it is enlarged in width from W1 to W2 (referring to FIG. 4B) in the horizontal direction.

Figure 4B:
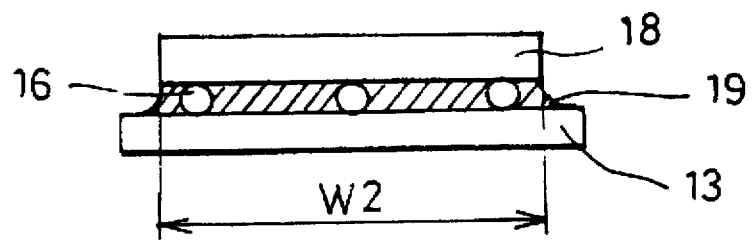
FIG. 4B is a cross-sectional view of a completed flip chip package.

FIG. 4B is a cross-sectional view of a completed flip chip package. As shown in this figure, an under-fill region 19 is formed as the under-fill substance layer 14 (referring to FIG. 4A) is compressed. The under-fill region 19 connects the semiconductor chip 18 to the printed circuit board 13 without having any influence on the solder balls 16. That is, with the interconnection structure of the present invention, the solder balls 16 are bonded by a single step, and the under-fill substance layer 14 is compressed by the compressing means, so that the semiconductor chip 18 is favorably bonded to the printed circuit board.

As so far described, according to the interconnection structure of the present invention, when the solder balls or metal bumps placed on the semiconductor. chip are bonded on the substrate, the under filling is simultaneously performed, so that manufacturing process is simplified and its productivity can be improved. Also, in a wafer process, the under-fill substance is compressed after being deposited, so that an interfacial bonding force between the semiconductor chip and the printed circuit board is increased while any void between them is removed, thereby improving reliability.

What is claimed is:

1. A module for mounting a semiconductor device on a substrate, the semiconductor device having a plurality of conductive media for conductive connection to the substrate, comprising:

an interconnection structure having a plurality of holes for receiving said plurality of conductive media to allow a conductive connection between the semiconductor device and the substrate, wherein said interconnection structure is in contact with said semiconductor device and the substrate to adhesively bond the semiconductor device to the substrate.

2. The module of claim 1, wherein said plurality of conductive media is at least one of a plurality of solder balls and bumps.

3. The module of claim 1, wherein said interconnection structure is an under-fill substance layer.

4. The module of claim 1, wherein the substrate is a printed circuit board.

5. The module of claim 1, wherein said interconnection structure has a width which is larger than that of the semiconductor device after the interconnection structure adhesively bonds the semiconductor device to the substrate.

6. The module of claim 1, wherein a diameter of each of said plurality of holes is substantially the same as corresponding one of said plurality of conductive media such that said plurality of conductive media fits snugly into said plurality of holes.

7. The module of claim 1, wherein each of said plurality of conductive media has first and second ends and said interconnection structure has first and second surfaces and said plurality of holes extend from said first surface to said second surface, and said plurality of conductive media is inserted through said plurality of holes from said first surface to said second surface such that said second ends of said plurality of conductive media extend beyond said second surface of the interconnection structure.

8. The module of claim 7, wherein said first surface of said interconnection structure contacts the semiconductor device.

9. The module of claim 1, wherein said plurality of holes have a round shape.

* * * * *